(12) United States Patent
Yanagihara et al.

(10) Patent No.: US 6,677,625 B2
(45) Date of Patent: Jan. 13, 2004

(54) BIPOLAR TRANSISTOR

(75) Inventors: Manabu Yanagihara, Osaka (JP);
Keiichi Murayama, Osaka (JP);
Takeshi Fukui, Osaka (JP); Tsuyoshi Tanaka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/741,032

(22) Filed: Dec. 21, 2000

(65) Prior Publication Data
US 2001/0010388 A1 Aug. 2, 2001

(30) Foreign Application Priority Data
Dec. 28, 1999 (JP) .............................. 11-373881

(51) Int. Cl.⁷ .................. H01L 31/072; H01L 31/109; H01L 31/0328; H01L 31/0336
(52) U.S. Cl. .............. 257/200; 257/197; 257/198; 257/578; 257/579
(58) Field of Search ................. 257/565, 567, 257/575–578, 197, 198, 200

(56) References Cited

U.S. PATENT DOCUMENTS

| | | | | |
|---|---|---|---|---|
| 5,675,175 A | | 10/1997 | Iranmanesh | |
| 5,682,046 A | * | 10/1997 | Takahashi et al. | 257/198 |
| 5,767,540 A | * | 6/1998 | Shimizu | 257/197 |
| 5,786,622 A | * | 7/1998 | Ronkainen | 257/578 |
| 5,828,124 A | * | 10/1998 | Villa | 257/557 |
| 5,837,589 A | * | 11/1998 | McNamara et al. | 438/314 |
| 6,043,520 A | * | 3/2000 | Yamamoto et al. | 257/198 |
| 6,236,071 B1 | * | 5/2001 | Finlay | 257/197 |
| 6,310,368 B1 | * | 10/2001 | Yagura | 257/197 |
| 6,355,947 B1 | * | 3/2002 | Niwa | 257/197 |

* cited by examiner

Primary Examiner—Nathan J. Flynn
Assistant Examiner—Jesse A. Fenty
(74) Attorney, Agent, or Firm—Nixon Peabody LLP; Donald R. Studebaker

(57) ABSTRACT

The invention provides a bipolar transistor attaining large MSG and a method of fabricating the same. The bipolar transistor of this invention includes a collector layer; a base layer deposited on the collector layer; and a semiconductor layer deposited on the base layer in the shape of a ring along the outer circumference of the base layer, the semiconductor layer includes a ring-shaped emitter region functioning as an emitter, and the outer edge of the emitter region and the outer edge of the base layer are disposed in substantially the same plane position.

6 Claims, 13 Drawing Sheets

BIPOLAR TRANSISTOR

BACKGROUND OF THE INVENTION

The present invention relates to a bipolar transistor and a method of fabricating the same, and more particularly, it relates to a bipolar transistor suitably used in mobile communication equipment and a method of fabricating the same.

Recently, a field effect transistor formed from GaAs with small power consumption (MESFET) is widely used as a transistor of a transmitting power amplifier used in mobile communication equipment such as a portable telephone. A negative power source is generally used for bias for a gate electrode of a MESFET. Accordingly, in using a MESFET in a transmitting power amplifier, two power sources, namely, a positive power source and a negative power source, are required. This is a disadvantage to downsizing of the amplifier, and hence, a transistor operated by using a positive power source alone is earnestly desired.

Furthermore, in recent communication systems such as CDMA (code division multi-channel access), an output current of a transmitting power amplifier is required to have small distortion (namely, to be linear). As a transistor meeting these requirements, a heterojunction bipolar transistor (HBT) including the emitter formed from a semiconductor having a larger band gap than a semiconductor forming the base is practically used.

As the materials for an HBT, GaAs and AlGaAs have been generally used for a base layer and an emitter layer, respectively, but InGaP having less surface recombination and higher reliability than AlGaAs is recently used for an emitter layer.

A performance index corresponding to a high operation speed of a bipolar transistor is a maximum oscillation frequency $f_{max}$, which is represented as follows:

$$f_{max} = (f_t/(8\pi R_b C_{bc}))^{1/2}$$

wherein $f_t$ indicates a cut-off frequency, $R_b$ indicates a base resistance and $C_{bc}$ indicates a base-collector capacity.

In an HBT, even when the base concentration is high, sufficient current amplification can be obtained owing to the effect of band discontinuity of the valence band ($\Delta Ev$). Therefore, the cut-off frequency $f_t$ can be increased by reducing the thickness of the base as well as the base resistance $R_b$ can be reduced by increasing the base concentration, so that the maximum oscillation frequency $f_{max}$ can be high.

When an HBT is used at a frequency of approximately 0.8 through 2 GHz used for portable telephones and the like, however, maximum stable gain (MSG) at the frequency is more significant than the maximum oscillation frequency $f_{max}$.

FIGS. 10 and 11 show the results of simulation of the MSG at a frequency of 2 GHz of a conventional HBT. FIG. 10 is a diagram of dependency on the base-collector capacity $C_{bc}$ of the MSG at 2 GHz of the conventional HBT, and FIG. 11 is a diagram of dependency on the base resistance $R_b$ of the MSG at 2 GHz of the conventional HBT. In these graphs, the abscissas are standardized by an initial value $C_{bc0}$ of the base-collector capacity $C_{bc}$ and an initial value $R_{b0}$ of the base resistance $R_b$, respectively. It is understood from the results that the MSG minimally depends upon the base resistance $R_b$ but largely depends upon the base-collector capacity $C_{bc}$ at a frequency of 2 GHz. Accordingly, in order to fabricate an HBT with large MSG, it is effective to employ a structure with a small base-collector capacity $C_{bc}$ for the HBT. For attaining a small base-collector capacity $C_{bc}$ in the HBT, it is effective to reduce the area of a region in the base where minority carriers are not injected from the emitter. Therefore, it is effective to dispose a base electrode between emitter regions in the sectional structure of the HBT. Now, a method of fabricating an HBT having such a structure will be described with reference to FIGS. 12A through 12D, 13A and 13B.

First, in a procedure shown in FIG. 12A, a collector contact layer 32 of $n^+$—GaAs, a collector layer 33 of $n^-$—GaAs, a base layer 34 of $p^+$—GaAs, an emitter layer 35 of n—InGaP and an emitter contact layer 36 of n—GaAs and $n^+$—InGaAs are successively deposited by epitaxial growth on a GaAs substrate 31. Then, a WSi film 37, that is, a metal film with a high melting point, is deposited thereon by sputtering.

Next, in a procedure shown in FIG. 12B, a resist (not shown) is formed on the substrate and is subsequently patterned. Then, an opening for exposing a surface of the emitter contact layer 36 is formed in the WSi layer 37 through reactive dry etching using the resist as a mask. Thus, the WSi layer 37 is formed into an emitter electrode 38 having the opening for exposing the surface of the emitter contact layer 36.

Then, in a procedure shown in FIG. 12C, the emitter contact layer 36 of n—GaAs and $n^+$—InGaAs is patterned through etching using the emitter electrode 38 as a mask and a mixture of sulfuric acid, hydrogen peroxide and water as an etchant. At this point, the emitter layer 35 of n—InGaP is never etched by the etchant (the mixture of sulfuric acid, hydrogen peroxide and water). Specifically, the emitter contact layer 36 is patterned by completely selective etching in this procedure.

Next, in a procedure shown in FIG. 12D, a resist pattern (not shown) for defining a base region on the substrate is formed. By using the resist pattern as a mask, the emitter layer 35 is patterned through etching using an etchant of a mixture of hydrochloric acid and water. Thereafter, through etching using an etchant of a mixture of sulfuric acid, hydrogen peroxide and water, the base layer 34 is patterned and the collector layer 33 is partly etched.

Subsequently, in a procedure shown in FIG. 13A, a resist pattern (not shown) for forming a collector electrode on the substrate is formed. By using the resist pattern as a mask, an opening for exposing a surface of the collector contact layer 32 is formed in the collector layer 33 through etching using an etchant of a mixture of sulfuric acid, hydrogen peroxide and water. Then, a collector electrode 39 of AuGe/Au is formed by lift-off on the surface of the collector contact layer 32 exposed in the opening. Thereafter, a heat treatment is carried out at 450° C., so that the collector electrode 39 can attain a good ohmic characteristic.

Next, in a procedure shown in FIG. 13B, a resist pattern (not shown) for forming a base electrode on the substrate is formed. By using the resist pattern as a mask, an opening for exposing a surface of the base layer 34 is formed in the emitter layer 35 through etching using an etchant of a mixture of hydrochloric acid and water. Then, a base electrode 40 of Ti/Pt/Au is formed by the lift-off on the surface of the base layer 34 exposed in the opening.

Through the aforementioned procedures, an HBT having the structure with a small base-collector capacity $C_{bc}$ is completed.

Furthermore, in order to reduce surface recombination, which leads to decrease of the current amplification, on the interface between the emitter and the base of the HBT, the emitter layer 35 is generally formed from an emitter region 41 disposed below the emitter contact layer 36 and depleted emitter protection layers 42 and 43 formed in the periphery of the emitter region 41 as is shown in FIG. 14. The depleted emitter protection layers 42 and 43 are also designated as guard rings or ledges.

The conventional HBT described above has, however, a problem that sufficient MSG cannot be attained at a frequency of several GHz.

SUMMARY OF THE INVENTION

The present invention was devised to overcome the aforementioned problem, and an object is providing a bipolar transistor attaining large MSG and a method of fabricating the same.

The bipolar transistor of this invention comprises a collector layer; a base layer deposited on the collector layer; and a semiconductor layer deposited on the base layer in the shape of a ring along an outer circumference of the base layer, wherein the semiconductor layer includes a ring-shaped emitter region functioning as an emitter, and an outer edge of the emitter region and an outer edge of the base layer are disposed in substantially the same plane position.

Accordingly, the base area is reduced as compared with that of a conventional bipolar transistor. As a result, the bipolar transistor can attain a small base-collector capacity $C_{bc}$ and large MSG.

The emitter region may be formed in the shape of a closed ring.

Alternatively, the emitter region may be formed in the shape of an opened ring.

The bipolar transistor can further comprise an emitter contact layer deposited on the semiconductor layer in the shape of a ring along the outer circumference of the base layer.

The semiconductor layer can include, on the inside of the emitter region, a ring-shaped inside protection layer projecting inward beyond the emitter contact layer.

The semiconductor layer can include, on the outside of the emitter region, a ring-shaped outside protection layer projecting outward beyond the base layer.

The semiconductor layer may have a larger forbidden band width than the base layer.

The semiconductor layer can be formed from InGaP and the base layer can be formed from GaAs.

The method of fabricating a bipolar transistor of this invention comprises the steps of (a) preparing a substrate having a first semiconductor layer, a second semiconductor layer deposited on the first semiconductor layer and a third semiconductor layer deposited on the second semiconductor layer; (b) patterning the third semiconductor layer and the second semiconductor layer by using a first etching mask formed over the third semiconductor layer; and (c) patterning the third semiconductor layer into a ring shape by using a second etching mask formed over the third semiconductor layer, wherein the first semiconductor layer, the second semiconductor layer and the third semiconductor layer are respectively formed into a collector, a base and an emitter.

Accordingly, the third semiconductor layer for forming the emitter and the second semiconductor layer for forming the base are patterned by using the same etching mask. Therefore, the outer edge of the emitter and the outer edge of the base are disposed in substantially the same plane position. Accordingly, the area of a region in the base where minority carriers are not injected from the emitter can be reduced as compared with that of a conventional bipolar transistor. As a result, the bipolar transistor can attain a small base-collector capacity $C_{bc}$ and large MSG.

The substrate may further have a fourth semiconductor layer deposited on the third semiconductor layer in the step (a), the first etching mask is formed over the fourth semiconductor layer, and the fourth semiconductor layer, the third semiconductor layer and the second semiconductor layer can be patterned by using the first etching mask in the step (b), the second etching mask is formed over the fourth semiconductor layer, and the fourth semiconductor layer can be patterned into a ring shape by using the second etching mask in the step (c), and the method can further include a step (d) of patterning the third semiconductor layer into a ring shape by using a ring-shaped third etching mask formed over the third semiconductor layer and projecting inward beyond the fourth semiconductor layer in the shape of a ring.

A semiconductor used for forming the third semiconductor layer may have a larger forbidden band width than a semiconductor used for forming the second semiconductor layer.

The third semiconductor layer can be formed from InGaP and the second semiconductor layer can be formed from GaAs.

DETAILED DESCRIPTION OF THE INVENTION

Figure 1A:
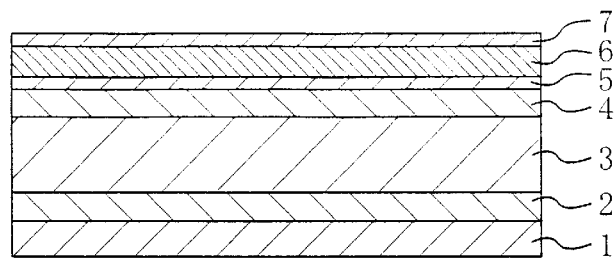
FIGS. 1A, 1B, 1C and 1D are cross-sectional views for showing procedures in a method of fabricating a bipolar transistor according to an embodiment of the invention.

Preferred embodiments of the invention will now be described with reference to the accompanying drawings, in which like reference numerals are used to refer to like elements commonly used in the respective embodiments for simplification.

Figure 14:
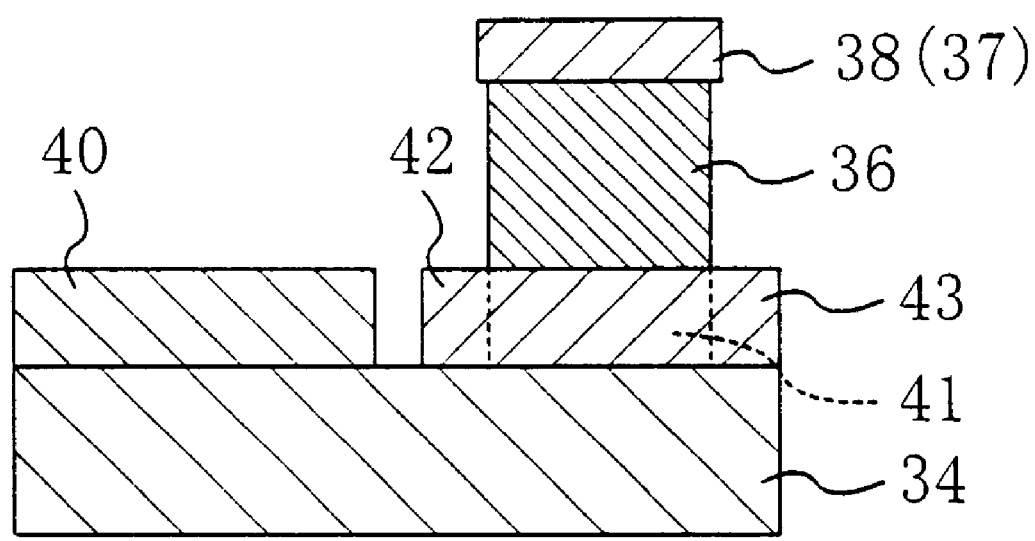
FIG. 14 is an enlarged cross-sectional view of a portion in the vicinity of the emitter and the base of the conventional HBT.

As is shown in FIG. 14, the base layer 34 is present below the emitter protection layer 43 formed on the outside of the emitter region 41 of the conventional HBT. The present inventors have concluded that the base area can be reduced by eliminating a portion of the base layer 34 disposed below the emitter protection layer 43 so as to reduce the base-collector capacity $C_{bc}$. A bipolar transistor of this embodiment is fabricated on the basis of this conclusion.

A method of fabricating the bipolar transistor of this embodiment will now be described.

FIGS. 1A through 1D and 2A through 2C are sectional views for showing procedures in the method of fabricating the bipolar transistor of this embodiment.

First, in the procedure shown in FIG. 1A, a collector contact layer 2 of $n^+$—GaAs, a collector layer 3 of $n^-$—GaAs, a base layer 4 of $p^+$—GaAs, an emitter layer 5 of $n^-$—InGaP and an emitter contact layer 6 of n—GaAs and $n^+$—InGaAs are successively formed by epitaxial growth on a GaAs substrate 1. Then, a WSi film 7, that is, a metal film with a high melting point, is deposited thereon by sputtering.

Figure 1B:
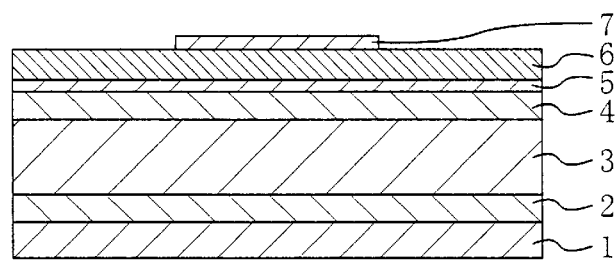

Next, in the procedure shown in FIG. 1B, a resist (not shown) is patterned on the WSi film 7. Thereafter, the WSi film 7 is patterned through reactive dry etching using the resist as a mask.

Figure 1C:
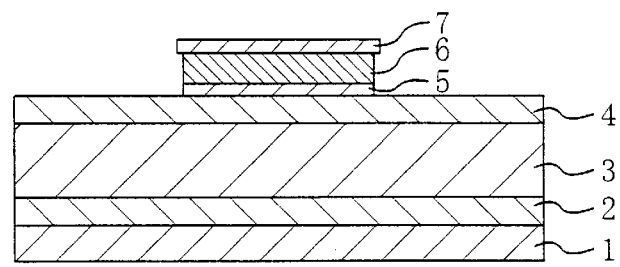

Then, in the procedure shown in FIG. 1C, by using the WSi film 7 as a mask, the emitter contact layer 6 is patterned through etching using an etchant of a mixture of sulfuric acid, hydrogen peroxide and water. Subsequently, the emitter layer 5 is patterned through etching using an etchant of a mixture of hydrochloric acid and water.

Figure 1D:
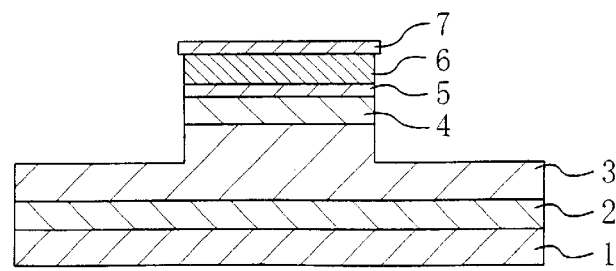

Next, in the procedure shown in FIG. 1D, still by using the WSi film 7 as the mask, the base layer 4 is patterned and the collector layer 3 is partly etched through etching using an etchant of a mixture of sulfuric acid, hydrogen peroxide and water.

Furthermore, a resist (not shown) is formed on the substrate and the resist is patterned into the shape of a ring. Then, the WSi film 7 is patterned into the shape of a ring through the reactive dry etching using the resist as a mask, so as to form an opening for exposing a surface of the emitter contact layer 6. Thus, the WSi film 7 is formed into an emitter electrode 8 having the opening for exposing the surface of the emitter contact layer 6.

Figure 2A:
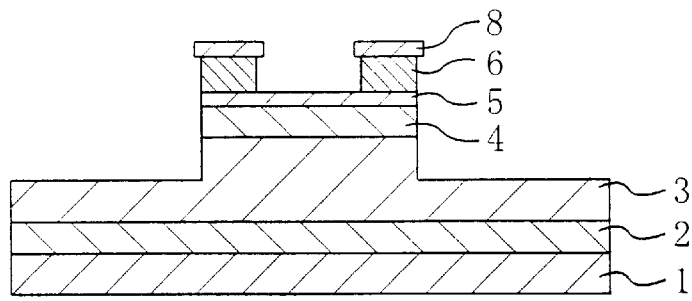
FIGS. 2A, 2B and 2C are cross-sectional views for showing other procedures in the method of fabricating the bipolar transistor according to the embodiment of the invention.

Next, in the procedure shown in FIG. 2A, by using the emitter electrode 8 as a mask, an opening for exposing a surface of the emitter layer 5 is formed in the emitter contact layer 6 through etching using an etchant of a mixture of sulfuric acid, hydrogen peroxide and water.

Figure 2B:
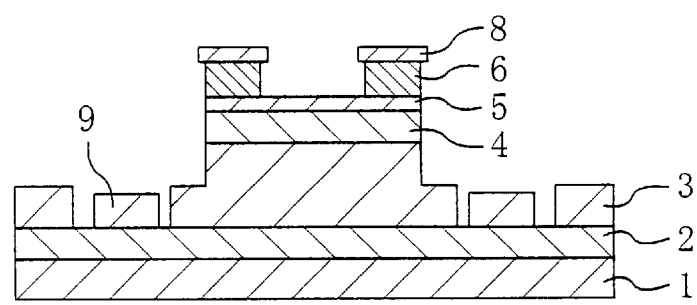

Then, in the procedure shown in FIG. 2B, a resist pattern (not shown) for forming a collector electrode on the substrate is formed. By conducting etching using the resist pattern as a mask and using an etchant of a mixture of sulfuric acid, hydrogen peroxide and water, a collector electrode 9 of AuGe/Au is formed by lift-off on the collector contact layer 2. Thereafter, a heat treatment is carried out at 450° C., so that the collector electrode 9 can attain an ohmic characteristic.

Figure 2C:
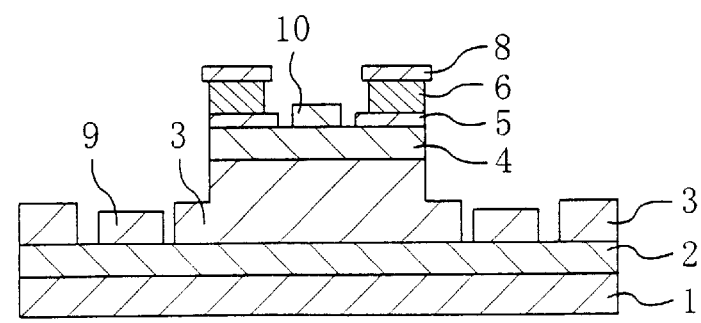

Next, in the procedure shown in FIG. 2C, for forming a base electrode on the substrate, a resist pattern in the shape of a ring covering an area larger than the emitter contact layer 6 is formed on the emitter layer 5. By using the resist pattern as a mask, an opening for exposing a surface of the base layer 4 is formed in the emitter layer 5 through etching using an etchant of a mixture of hydrochloric acid and water. Subsequently, a base electrode 10 of Ti/Pt/Au is formed by the lift-off on the surface of the base layer 4 exposed in the opening.

Through the aforementioned procedures, the bipolar transistor of this embodiment is completed.

Figure 3:
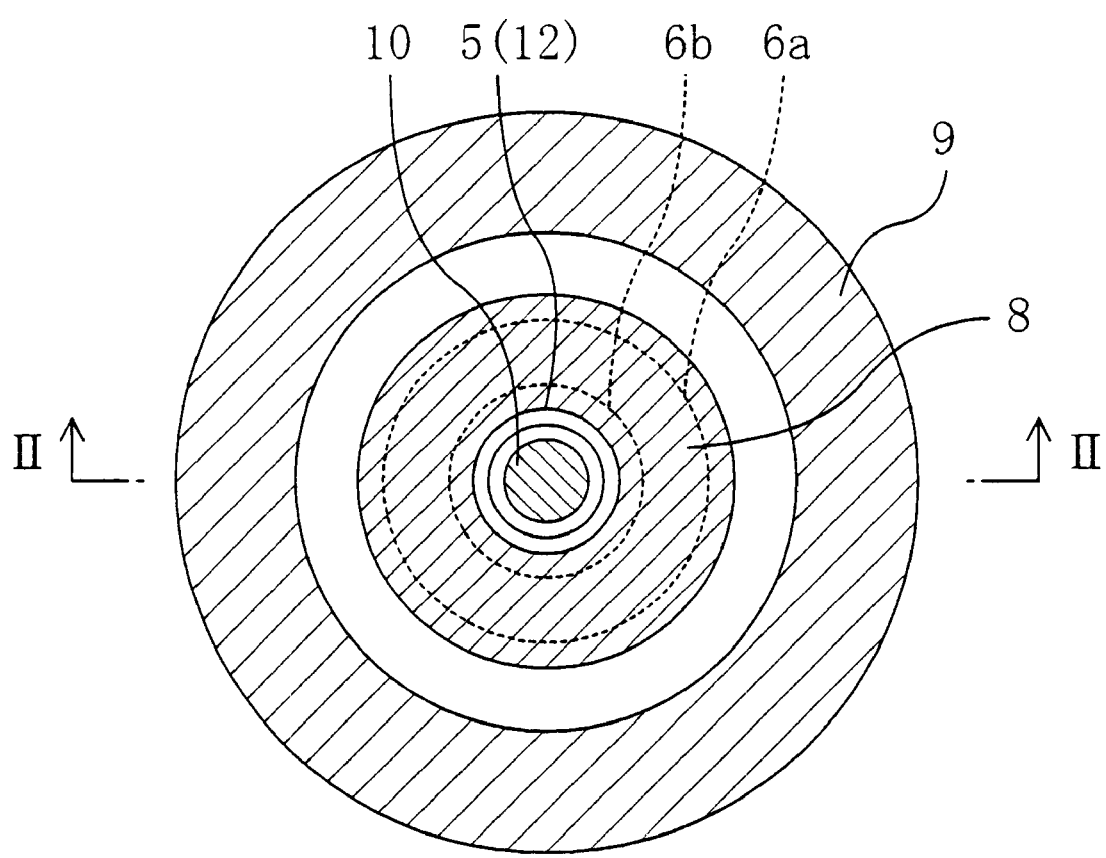
FIG. 3 is a top view of the bipolar transistor of the embodiment.

FIG. 3 is a plan view of the bipolar transistor of this embodiment shown in FIG. 2C. Specifically, a sectional view taken on line II—II of FIG. 3 corresponds to FIG. 2C.

As described above, the emitter contact layer 6 is formed in a self-alignment manner against the emitter electrode 8 in the procedure of FIG. 2A and is side-etched due to the influence of the wet etching. Therefore, the outer circumference of the emitter contact layer 6 is indicated with a broken line 6a and the inner circumference thereof is indicated with a broken line 6b. Although the bipolar transistor of this embodiment has the emitter contact layer 6 in a perfectly round shape as is shown in FIG. 3, the emitter contact layer is not necessarily in the perfectly round shape.

Figure 4:
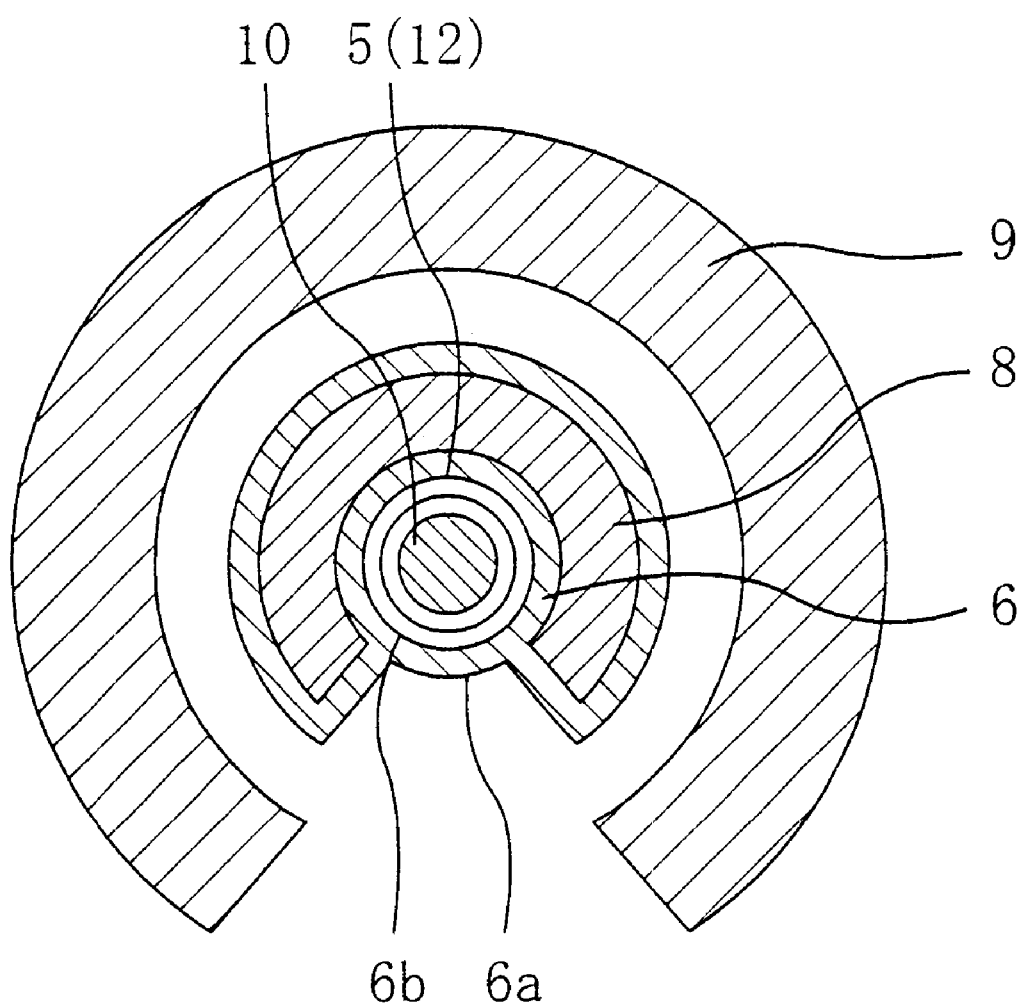
FIG. 4 is a top view of a bipolar transistor according to another embodiment.

FIG. 4 is a plan view of an example of a bipolar transistor whose emitter contact layer 6 is not in the perfectly round shape. In this example, although the inner circumference 6b of the emitter contact layer 6 is circular, the outer circumference 6a thereof is formed from arcs and straight lines. In this case, the emitter electrode 8 is formed on the emitter contact layer 6 in the shape of an opened ring in a separate procedure. Therefore, when the emitter contact layer 6 has large sheet-resistance, an emitter region 11 functioning as the emitter is formed in a portion of the emitter layer 5 correspondingly to the emitter electrode 8. Specifically, the emitter region 11 is formed in the shape of an opened ring substantially the same as the shape of the emitter electrode 8 in a position substantially the same as the emitter electrode 8. Owing to this structure, a line drawn from the base electrode 10 can avoid crossing over the emitter electrode 8. Also, a step difference caused by a drawn line crossing the emitter contact layer 6 can be lowered. Accordingly, the drawn line is minimally broken.

Figure 5:
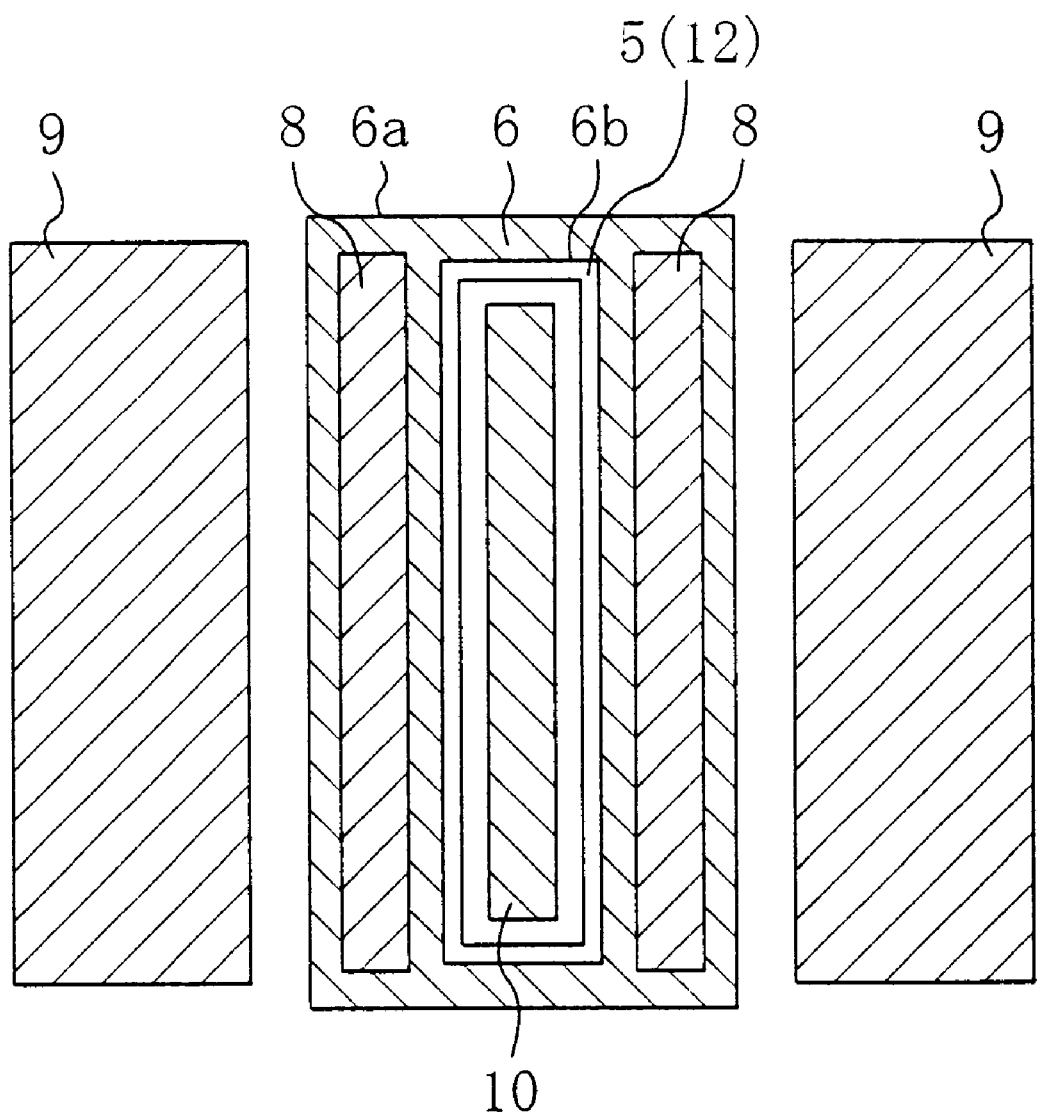
FIG. 5 is a top view of a bipolar transistor according to still another embodiment.

FIG. 5 is a plan view of another example of the bipolar transistor whose emitter contact layer 6 is not in the perfectly round shape. In FIG. 5, the emitter contact layer 6 is formed so as to surround the base electrode. The outer circumference of the emitter contact layer 6 is indicated with a line 6a and the inner circumference thereof is indicated with a line 6b. Also in this case, the emitter electrode 8 is formed on the emitter contact layer 6 in a separate procedure.

Figure 6:
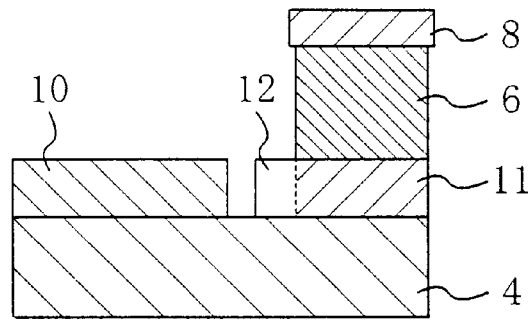
FIG. 6 is an enlarged cross-sectional view of a portion in the vicinity of the emitter and the base of the bipolar transistor of the embodiment.

FIG. 6 is an enlarged sectional view of a portion in the vicinity of the base electrode 10 and the emitter layer 5 of FIG. 2C. As is shown in FIG. 6, in the emitter layer 5, a portion disposed directly below the emitter contact layer 6 corresponds to the emitter region 11, and a portion excluding the emitter region 11, namely, a portion of the emitter layer 5 close to the base electrode 10, corresponds to an inside emitter protection layer 12.

In the procedures of FIGS. 1C and 1D, both the emitter contact layer 6 and the base layer 4 are patterned by using the WSi film 7 as the mask. The emitter region 11 of the emitter layer 5 disposed directly below the emitter contact layer 6 substantially functions as the emitter. Accordingly, in the bipolar transistor of this embodiment, the outer edge of the emitter region 11 is disposed in substantially the same plane position as the outer edge of the base layer 4 in contact with the emitter region 11. Therefore, the base area is reduced as compared with that in the conventional HBT, resulting in reducing the base-collector capacity $C_{bc}$.

Figure 7:
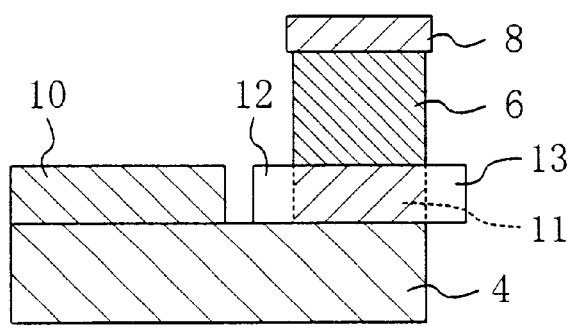
FIG. 7 is an enlarged cross-sectional view of a portion in the vicinity of the emitter and the base of a bipolar transistor according to another embodiment.

Furthermore, since InGaP and GaAs are completely selectively etched, the emitter layer 5 can be formed to have an outside emitter protection layer 13 projecting beyond the base layer 4 as is shown in FIG. 7. Also in this case, the outer edge of the emitter region 11 is disposed in substantially the same plane position as the outer edge of the base layer 4, and hence, the base area is not increased. Accordingly, the base-collector capacity $C_{bc}$ can be reduced.

Figure 8:
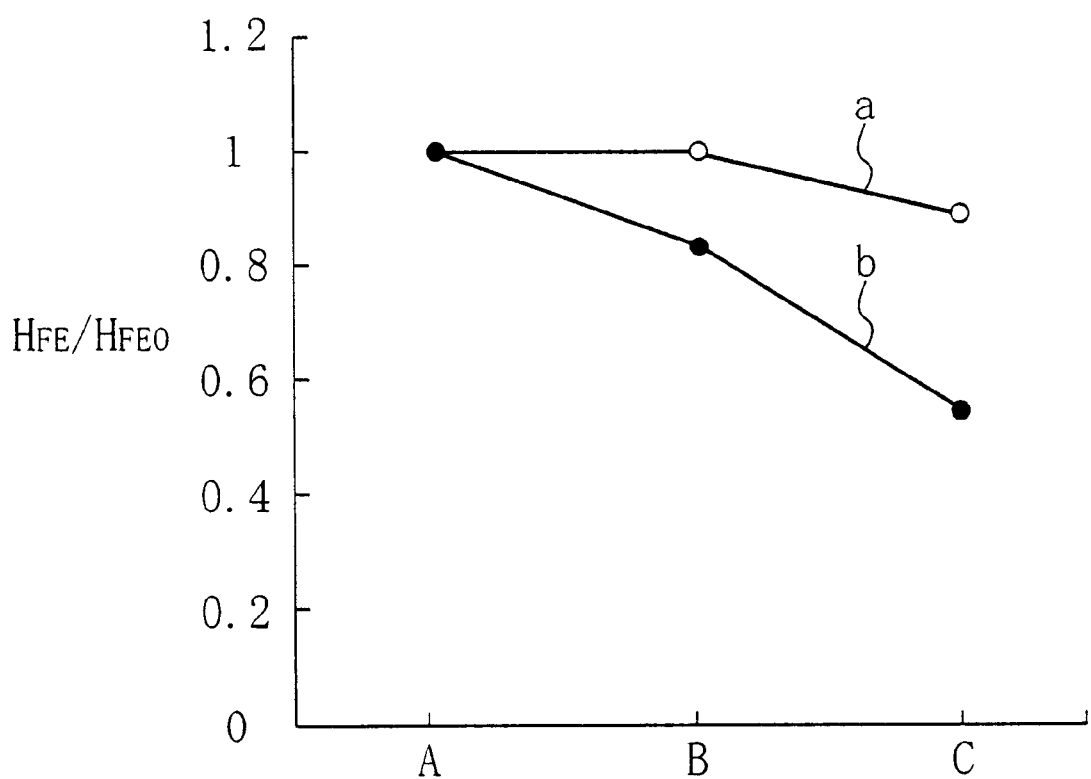
FIG. 8 is a diagram for showing the relationship between presence of an emitter protection layer and current amplification $H_{FE}$.

As described so far, in the bipolar transistor of this embodiment, the emitter layer does not have a portion formed on the outside of the emitter region (like the outside emitter protection layer 43 of the conventional HBT). FIG. 8 shows the result of examination of the influence of such a structure upon current amplification.

FIG. 8 shows the relationship between presence of an emitter protection layer formed on the inside or outside of a ring-shaped emitter region and the current amplification $H_{FE}$. A case A plotted on the abscissa corresponds to the relationship obtained in the conventional HBT (namely, in the structure shown in FIG. 14 where the emitter protection layers 42 and 43 are formed on the inside and the outside of the emitter region 41). A case B corresponds to the relationship obtained in the embodiment where the inside emitter protection layer 12 is formed as shown in FIG. 6. A case C corresponds to the relationship obtained in a structure where an emitter protection layer is formed neither on the inside nor on the outside of the emitter region 11, namely, in a structure where the emitter layer 5 and the emitter region 11 are in the same shape. Also, the relationship indicated by a line a is obtained in forming the emitter layer from InGaP and the relationship indicated by a line b is obtained in forming the emitter layer from AlGaAs.

The current amplification $H_{FE}$ indicated by the ordinate is standardized by the current amplification $H_{FEO}$ of the conventional structure. It is understood from the results that when the emitter layer is formed from InGaP, current amplification substantially the same as that of the conventional HBT including the emitter protection layers formed on the both sides can be attained by forming the emitter protection layer merely on a side close to the base electrode. Furthermore, it is understood that even when the emitter protection layer is formed on neither side, the decrease of the current amplification is merely approximately 10%, which does not cause a serious problem in practical use. This is probably because the current amplification is not largely affected by the emitter protection layer since surface recombination is inherently minimally caused in InGaP.

Figure 9:
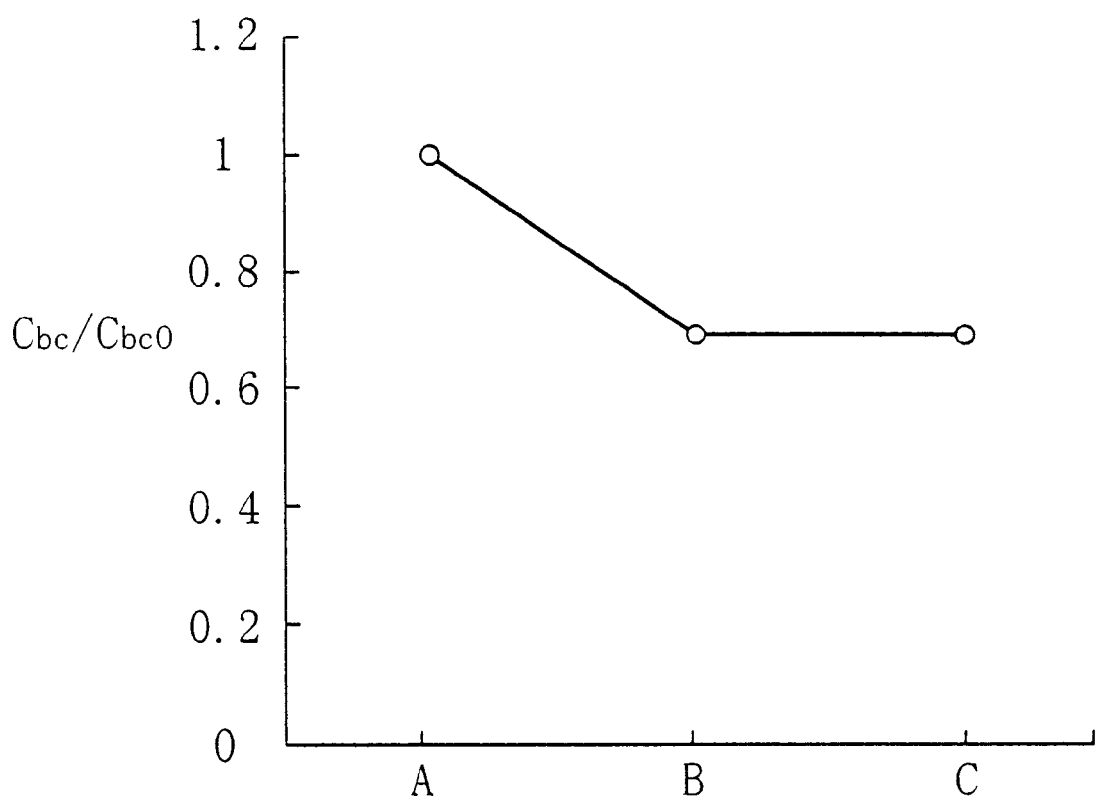
FIG. 9 is a diagram for showing the relationship between presence of the emitter protection layer and a base-collector capacity $C_{bc}$.
Figure 10:
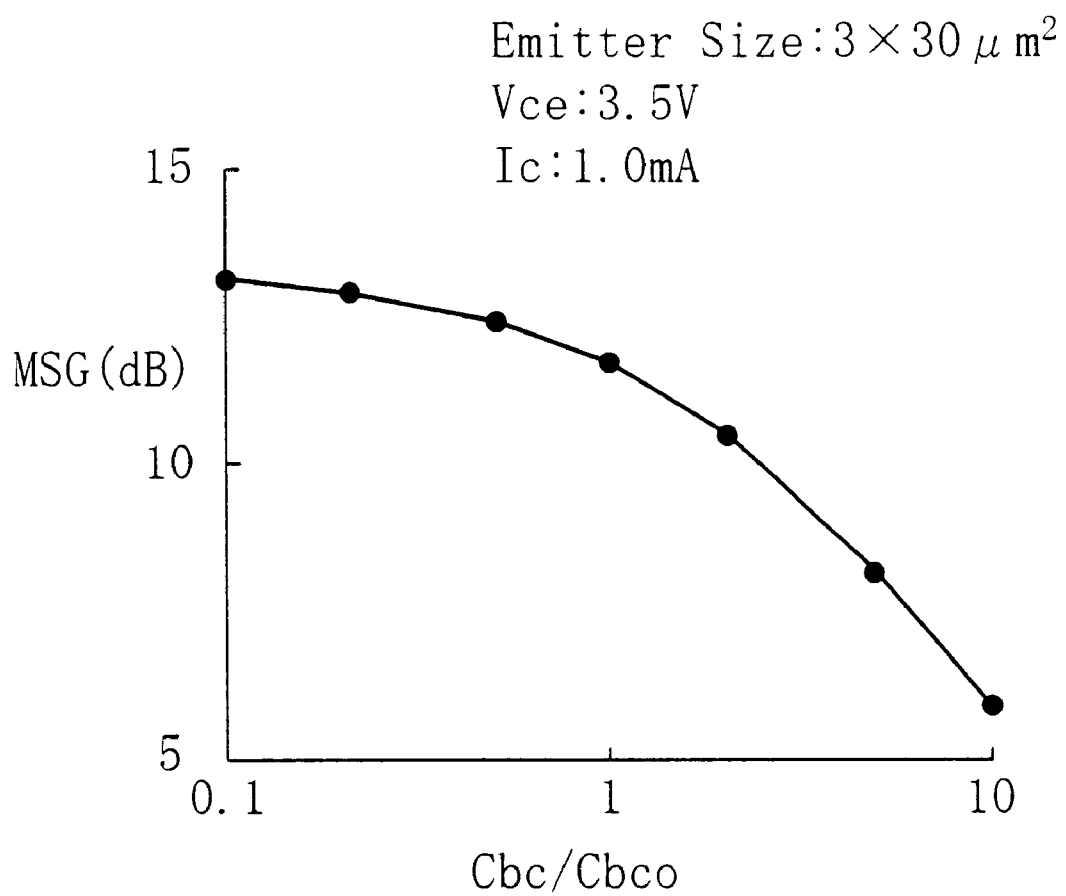
FIG. 10 is a diagram for showing the relationship between the base-collector capacity $C_{bc}$ and maximum stable gain (MSG)
Figure 11:
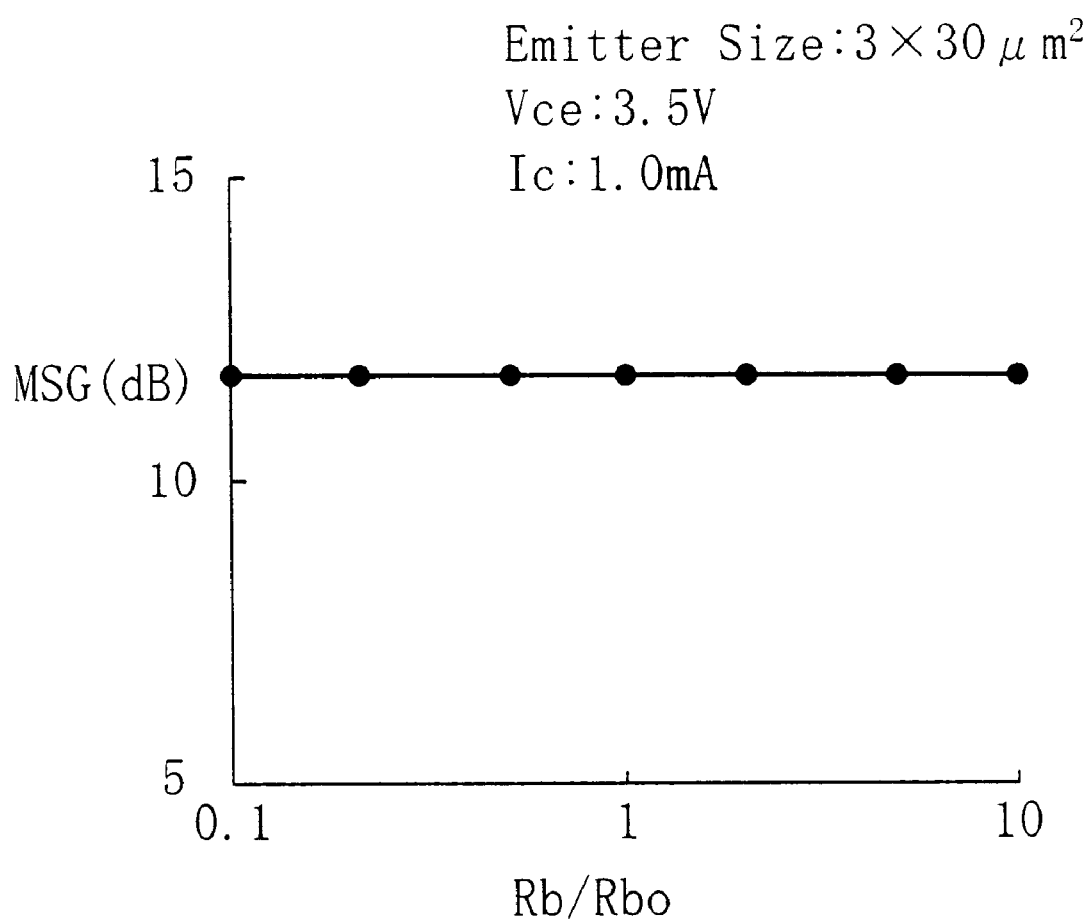
FIG. 11 is a diagram for showing the relationship between a base resistance $R_b$ and the maximum stable gain (MSG)
Figure 12A:
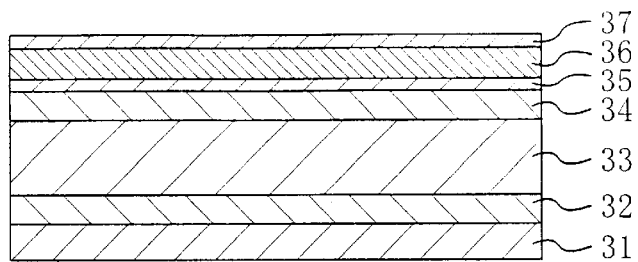
FIGS. 12A, 12B, 12C and 12D are cross-sectional views for showing procedures in a method of fabricating a conventional heterojunction bipolar transistor (HBT)
Figure 12B:
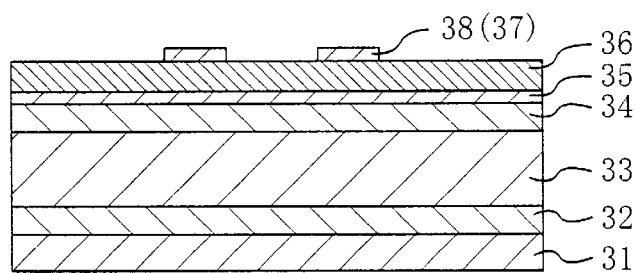
Figure 12C:
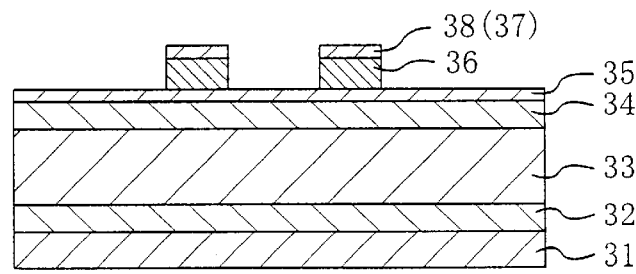
Figure 12D:
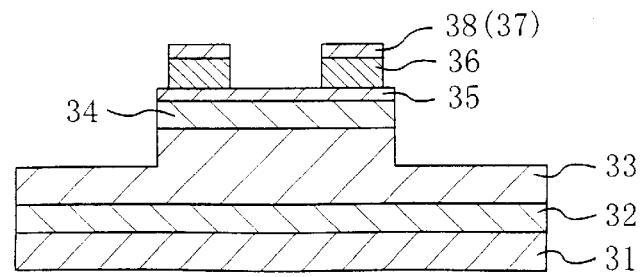
Figure 13A:
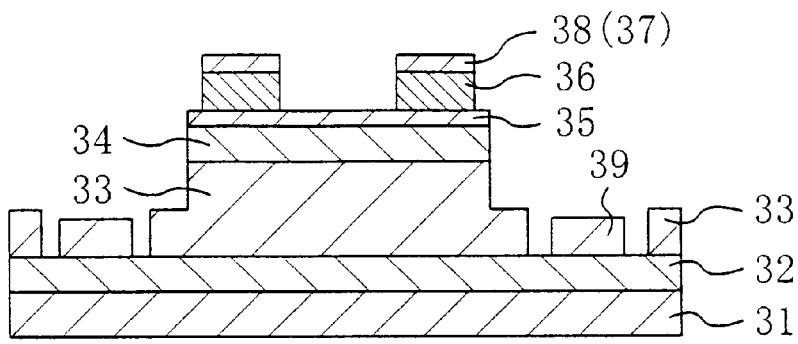
FIGS. 13A and 13B are cross-sectional views for showing other procedures in the method of fabricating the conventional HBT.
Figure 13B:
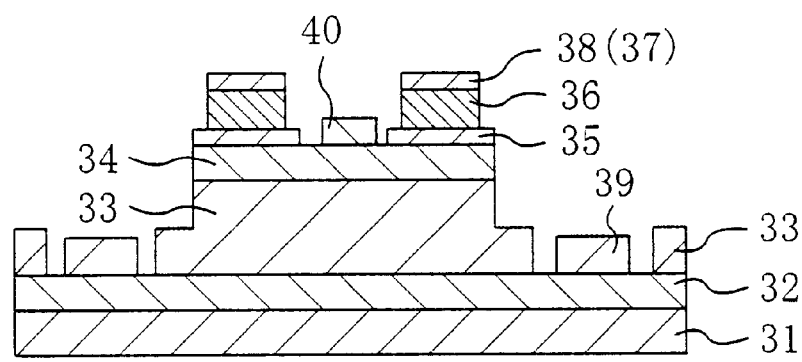

Moreover, the base-collector capacity $C_{bc}$ obtained in the respective bipolar transistors of the cases A, B and C are calculated and shown in FIG. 9. The base-collector capacity $C_{bc}$ indicated by the ordinate is standardized by the base-collector capacity $C_{bcO}$ of the conventional HBT. In the case B or C corresponding to the bipolar transistor of the embodiment, the base-collector capacity $C_{bc}$ is lowered by 30% or more as compared with that in the case A corresponding to the conventional HBT. It is assumed in this calculation that the radius of the inner circumference of the emitter layer 5 is 3 μm, that the radius of the outer circumference of the emitter layer 5 is 5 μm, and that the width of the emitter protection layer on the outside of the emitter layer 35 of the conventional HBT is 1 μm.

Although the method of fabricating an HBT of InGaP/GaAs is described in the embodiment, the method is applicable to an HBT of AlGaAs/GaAs or the like and a general homojunction bipolar transistor.

What is claimed is:

1. A bipolar transistor comprising:
   a collector layer;
   a base layer deposited on said collector layer;
   a semiconductor layer deposited on said base layer in the shape of a ring along an outer circumference of said base layer;
   an emitter contact layer deposited on said semiconductor layer in the shape of a ring along the outer circumference of said base layer;
   a base electrode formed on said base layer;
   an emitter electrode formed on said emitter contact layer and is provided on the outer side of said base electrode; and
   a collector electrode formed on said collector layer and is provided on the outer side of said emitter electrode,
   wherein said semiconductor layer includes a ring-shaped emitter region functioning as an emitter,
   an outer edge of said emitter region and an outer edge of said base layer are disposed in substantially the same plane position, and
   wherein said semiconductor layer includes, on the inside of said emitter region, a ring-shaped inside protection layer composed of InGaP projecting inward beyond said emitter contact layer.

2. The bipolar transistor of claim 1, wherein said emitter region is formed in the shape of a closed ring.

3. The bipolar transistor of claim 1, wherein said emitter region is formed in the shape of an opened ring.

4. The bipolar transistor of claim 1, wherein said semiconductor layer has a larger band gap than said base layer.

5. A bipolar transistor comprising:
   a collector layer;
   a base layer deposited on said collector layer;
   a semiconductor layer deposited on said base layer in the shape of a ring along an outer circumference of said base layer;
   a base electrode formed on said base layer;
   an emitter electrode formed on said emitter contact layer and is provided on the outer side of said base electrode; and
   a collector electrode formed on said collector layer and is provided on the outer side of said emitter electrode,
   wherein said semiconductor layer includes a ring-shaped emitter region functioning as an emitter,
   an outer edge of said emitter region and an outer edge of said base layer are disposed in substantially the same plane position, and
   wherein said semiconductor layer includes, on the outside of said emitter region, a ring-shaped outside protection layer composed of InGaP projecting outward beyond said base layer.

6. The bipolar transistor of claim 4,
   wherein said semiconductor layer is formed from InGaP and said base layer is formed from GaAs.

* * * * *